United States Patent
Aksu

[11] Patent Number: 5,956,835
[45] Date of Patent: Sep. 28, 1999

[54] TEST FIXTURES FOR TESTING OF PRINTED CIRCUIT BOARDS

[76] Inventor: Allen Aksu, 1044 Santiago Dr., Newport Beach, Calif. 92660

[21] Appl. No.: 08/799,707

[22] Filed: Feb. 11, 1997

Related U.S. Application Data

[63] Continuation-in-part of application No. 08/317,163, Oct. 3, 1994, abandoned.

[51] Int. Cl.[6] .................................................. B23Q 3/00
[52] U.S. Cl. .............................. 29/468; 29/559; 361/784; 361/804; 174/166 S
[58] Field of Search .................................... 361/742, 758, 361/770, 784, 785, 790, 804; 174/166 S; 29/464, 468, 559

[56] References Cited

U.S. PATENT DOCUMENTS

| | | | |
|---|---|---|---|
| 2,940,016 | 6/1960 | Flint et al. ............................ | 174/166 S |
| 4,730,237 | 3/1988 | Locker ..................................... | 361/784 |
| 4,760,495 | 7/1988 | Till .......................................... | 361/784 |
| 4,875,140 | 10/1989 | Delpech et al. ........................ | 361/804 |
| 4,969,065 | 11/1990 | Petri ........................................ | 361/804 |
| 5,223,674 | 6/1993 | Reznikov ............................ | 174/166 S |
| 5,340,258 | 8/1994 | Simon ..................................... | 411/535 |

FOREIGN PATENT DOCUMENTS 939899  10/1963  United Kingdom ................... 361/784

*Primary Examiner*—David P. Bryant
*Attorney, Agent, or Firm*—Myers, Dawes & Andras LLP

[57] ABSTRACT

There is disclosed a fastener useful for the precise positioning of a plurality of plates in a parallel, spaced-apart array. The fastener has a cylindrical standard with distal fixed abutments and carries a plurality of spacers that are axially adjustable on the standard. At least one spacer is axially extendable, and has a user-adjustable cam to control its axial length, thereby accommodating for variable thicknesses of the intermediate plates. The fastener is disclosed as particularly useful for the precise orientation of the parallel plates of a fixture used in equipment for automated testing of printed circuit boards.

11 Claims, 5 Drawing Sheets

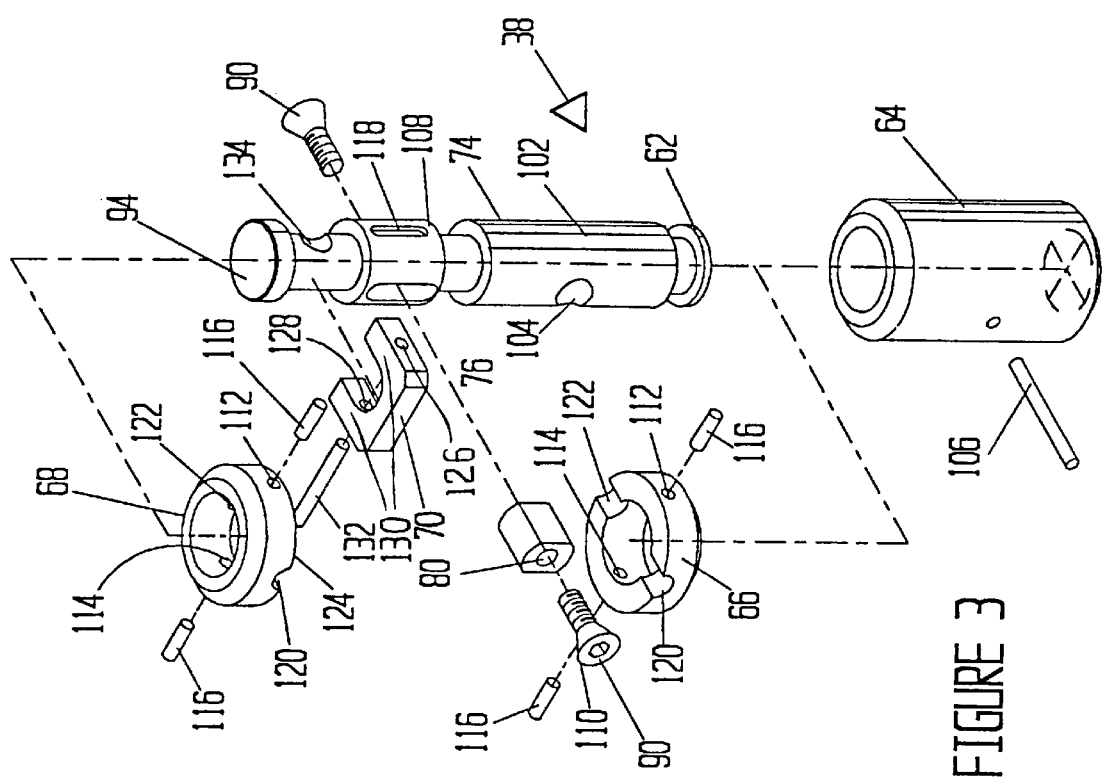

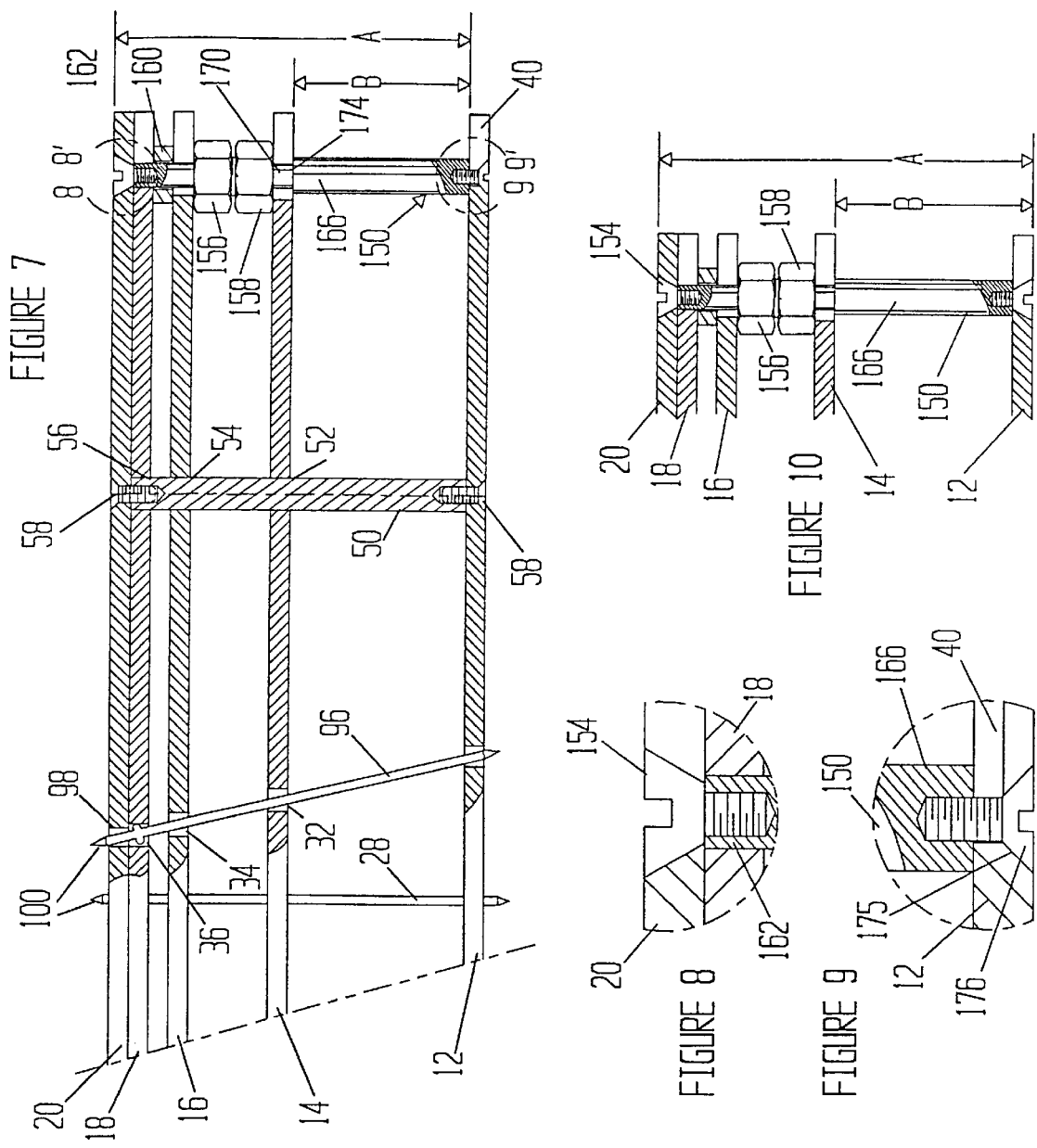

TEST FIXTURES FOR TESTING OF PRINTED CIRCUIT BOARDS

RELATIONSHIP TO OTHER APPLICATIONS

This application is a continuation-in-part of my application, Ser. No. 08/317,163, filed Oct. 3, 1994, now abandoned.

BACKGROUND OF THE INVENTION

1. Field of Invention

This invention relates to test fixtures for testing of printed circuit boards having test pins supported by multiple plates in parallel, spaced-apart array and, in particular, to fasteners and their use to keep multiple plates of the test fixtures at precise heights.

2. Brief Statement of the Prior Art

The automated testing of printed circuit boards to detect manufacturing flaws and defects is commonly performed with a mechanical press with one or two fixtures resting on the platens of the press. The fixtures have many spring pins which are located at preselected points for testing of a printed circuit board with pin-to-pin spacing being from 0.05 to 0.1 inch. The plates for the fixtures are usually predrilled with a grid-like distribution of holes at the aforementioned uniformed spacings.

Printed circuit board manufacturing capability, however, has advanced to very compact configuration, particularly with surface mounted components such as integrated circuits. These surface mounted components are mounted with connections which are at closer spacings than 0.05 inch, which is the closest pin-to-pin distance that can be practically provided with a uniform grid pattern of test pins. Accordingly, there is an increasing demand for fixtures which translate the geometrically uniform grid locations of spring test pins to off-grid locations.

A plurality of wire probes are supported in a fixture formed of two or more insulating plates separated by spacers, have been used as such fixtures.

In my prior patent, U.S. Pat. No. 5,307,560, issued May 3, 1994, I disclosed a method and apparatus useful in the automated loading of probes into a fixture. This method and apparatus utilizes a fixture formed of a plurality, usually three to four, rectangular plates which are retained by a plurality of standoffs or spacers between the plates. The fixtures require a close tolerance in the vertical separation of their uppermost and lowermost plates to insure a precise extension of the probes above the uppermost plate. This requirement is particularly important for the off-grid probes, which are canted in the fixture such that any imprecision in the vertical spacing can introduce a sufficient error in the lateral location of the end of the pins to fail to make contact with the test point on the printed circuit board.

In my prior patent, I disclosed that spacers can be placed between adjacent probe plates and assembly brackets can be placed over the edges of the probe plates and secured by screw fasteners. The vertical separation of the lowermost and uppermost plates are thus established by the sum of the thicknesses of the intermediate plates and the lengths of the 20 spacers.

The probe plates are formed of plastic sheet material, typically Plexiglass, which is available is standard thicknesses having a thickness tolerance of plus or minus 0.015 inch. When four plates are used to form the fixture, this tolerance can introduce an error in the height of the fixture as much as 0.06 inch. In an example of a probe which is canted at 15 degrees from vertical, the corresponding error in lateral location of the end of the probe can be from 0.015 to 0.025 inch, with the result that the probe can fail to make contact with the test point on the printed circuit board.

OBJECTIVES OF THE INVENTION

It is an objective of this invention to provide a method for assembling fixtures for testing printed circuit boards which have precisely controlled heights.

It is an objective of this invention to provide a fastener for precise positioning of a plurality of plates in a parallel, spaced-apart array.

It is an additional objective of this invention to provide a fastener which can be used to maintain parallel plates at precise heights in a fixture for automated testing of printed circuit boards.

It is a further object of this invention to provide a fastener which can be quickly fastened to the edges of a plurality of spaced-apart parallel plates and secure the precise orientation of those plates.

It is another objective of this invention to provide a fastener with fixed abutments or stops to precisely maintain the position of the outermost plates of a fixture.

It is also an objective of this invention to provide a fastener for precise vertical positioning of a plurality of parallel plates which includes at least one spacer having an extendable length axially of the fastener to accommodate for variable positioning of intermediate plates in the array.

It is a further objective of the invention to provide precise positioning of parallel plates for a test fixture using the fasteners of the invention.

Other and related objectives will be apparent from the following description of the invention.

BRIEF STATEMENT OF THE INVENTION

This invention comprises a fastener useful to position a plurality of plates at precise heights in a parallel, spaced-apart array. The fastener has a cylindrical standard with distal fixed abutments and carries a plurality of plate support elements that are axially adjustable on the standard. In one embodiment, the plate support elements are spacers and at least one spacer is axially extendable, and has a user adjustable cam to control its axial length, thereby accommodating for variable thicknesses of the intermediate plates. In another embodiment, all the support elements are threadably engaged with the post to permit their axial movement. The fasteners are disclosed as useful to achieve precise orientation of parallel plates during their assembly into a test fixture used in equipment for automated testing of printed circuit boards.

BRIEF DESCRIPTION OF THE DRAWINGS

The invention will be described with reference to the drawings of which:

FIG. 3 is an exploded perspective view of the fastener of the invention;

FIG. 7 is a partial sectional view of a fixture assembled with the fastener of FIG. 5;

FIG. 8 is an enlarged view of the area within line 8–8' of FIG. 7;

FIG. 9 is an enlarged view of the area within line 9–9' of FIG. 7; and

FIG. 10 is a partial sectional view of a fixture with an alternate embodiment of the fastener shown in FIG. 7.

DESCRIPTION OF PREFERRED EMBODIMENTS

Figure 1:
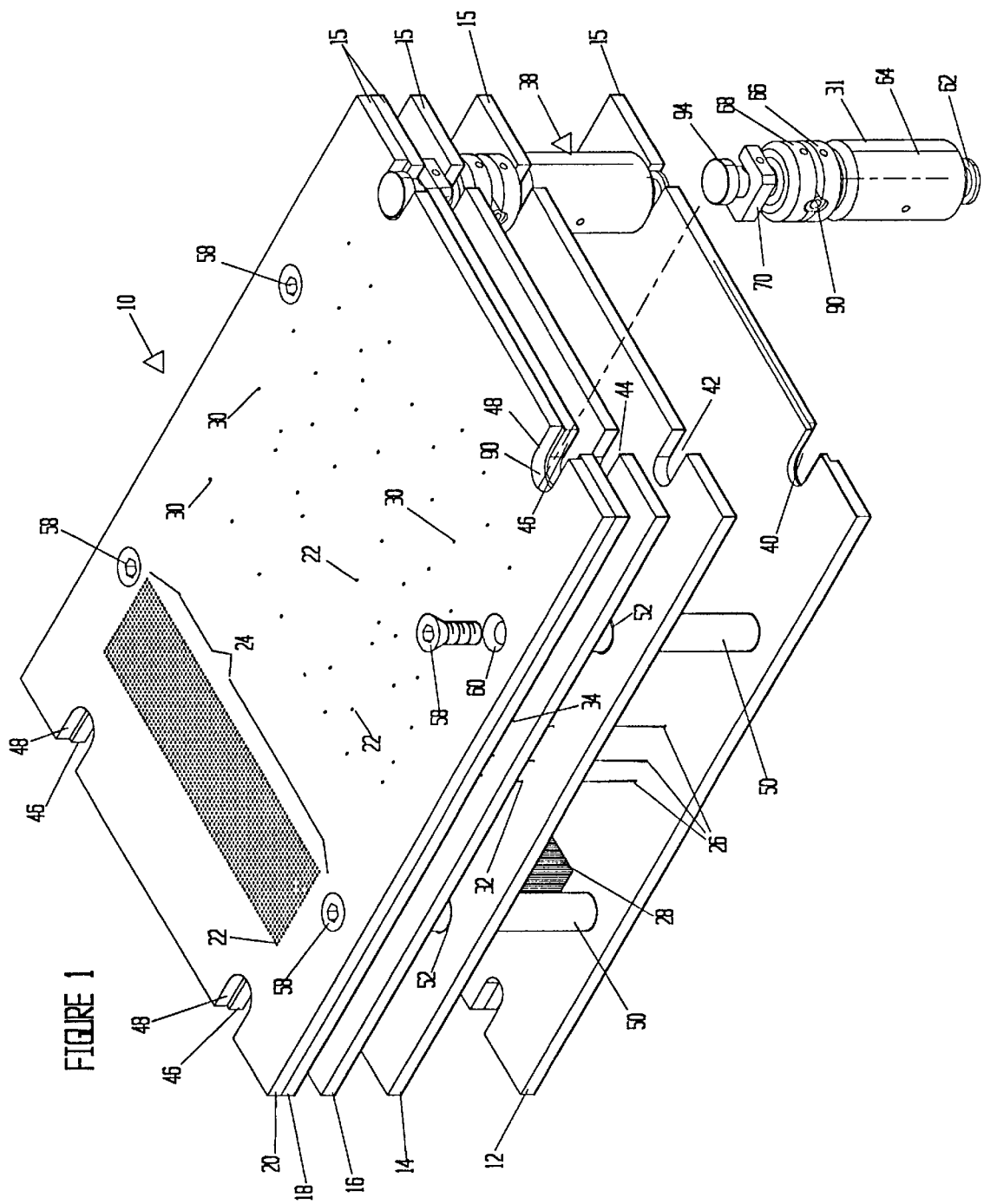
FIG. 1 is a perspective view of an assembled fixture utilizing the fasteners of this invention.

Referring now to FIG. 1, there is illustrated a perspective view of a fixture 10 with the fasteners of this invention. As there illustrated, the fixture 10 comprises a plurality of spaced apart rectangular plates 12, 14, 16, 18 and 20 which are maintained in a parallel, spaced-apart array. The plates are illustrated as rectangular as this is the most typically encountered arrangement for test fixtures and is thus the preferred embodiment. The plates, however, can have other shapes such as parallelograms or having more than four sides, depending on the specific application.

The plates typically span an area up to 24 by 36 inches. This area is reduced in scale considerably in the illustration for clarity. The uppermost plate 20 has a plurality of apertures 22 which are drilled through the plates at precise locations, such as those in area 24 which are distributed on a uniform grid pattern at a probe-to-probe spacing from about 0.05 to 0.1 inch. The intermediate plates 14, 16 and 18 and lowermost plate 12 also have apertures on the same uniform grid pattern, so that a plurality of straight, small diameter wire probes 28 can be placed, vertically, in the aligned apertures of the multiple plates.

Other apertures 30 through the uppermost plate are located at the test point positions for the printed circuit boards under testing, which are off-grid. All the apertures 26 in the lowermost plate 20 are located on the uniform grid spacings, and the apertures 32, 34 and 36 (see FIG. 2) in the intermediate plates are drilled at locations which are intermediate the lateral spacing between the aperture 30 in the uppermost plate 20 and the aperture 26 in the lowermost most plate 12. The apertures through the intermediate plates are of larger diameter than the apertures 98 in the uppermost plate and, accordingly, the spacing of these plates is not as critical as the separation distance between the lowermost plate 12 and uppermost plate 20.

The points are maintained in an assembly by the fasteners 38 of the invention which are located at strategic positions in notches 40, 42, 44, 46 and 48 cut into the edges 15 of the plates. Fastener 31 is illustrated in FIG. 1 removed from the assembly, exposing the aligned notches in each of the boards. These notches extend into the board for a short distance adequate to provide sufficient support on the fasteners. The notches in the boards are in lateral alignment to permit insertion of the fasteners 38. The uppermost board is also secured to the lowermost board by standoffs 50 which extend through aligned apertures 52, 54 and 56 (see FIG. 2) of the intermediate boards. Fasteners such as flat-headed machine screws 58 extend through countersunk apertures 60 (see FIG. 1) in the uppermost plate 20 and lowermost plate 12 to complete the assembly.

Figure 2:
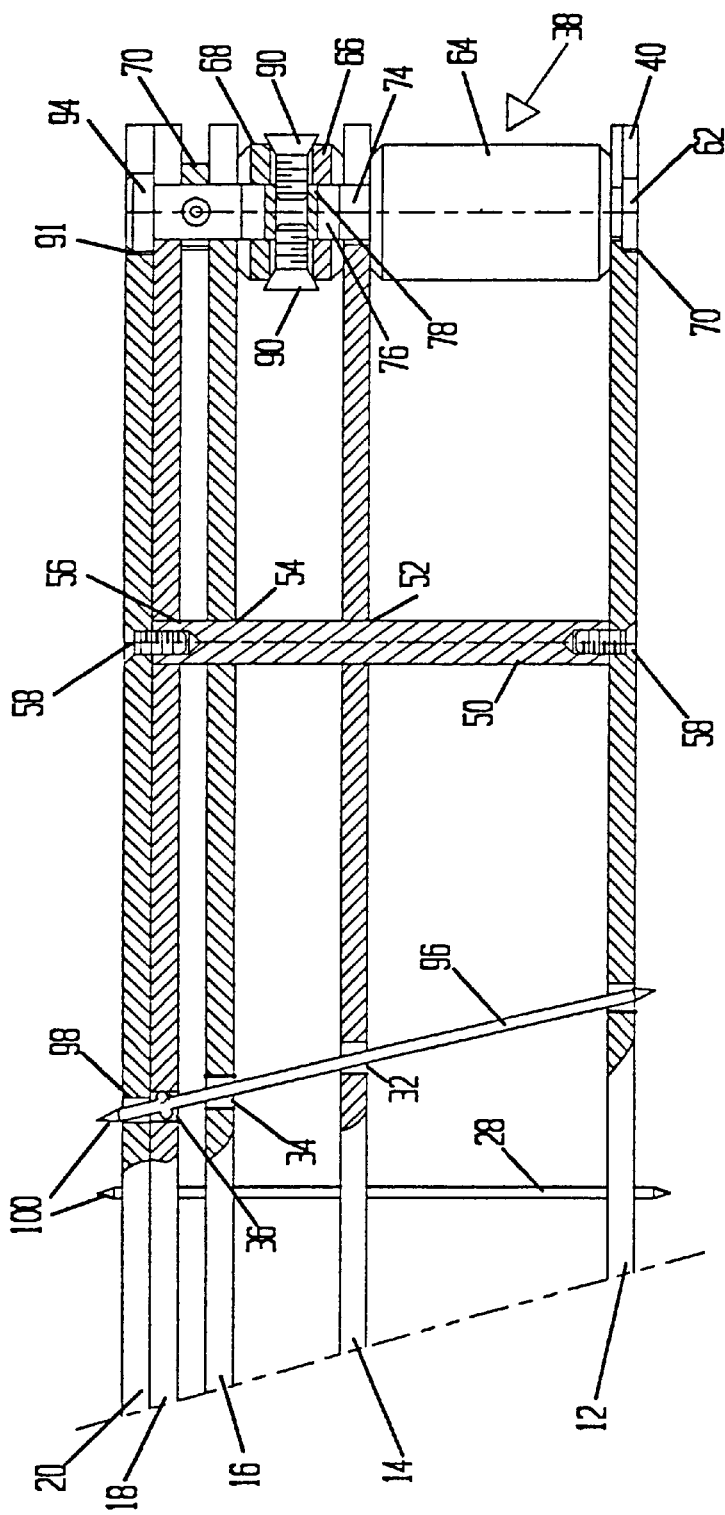
FIG. 2 is a partial sectional view of the fixture of FIG. 1.

Referring now to FIG. 2, the structure of the fasteners 38 and the standoffs 50 can be seen in greater detail. As there illustrated, the fastener 38 is seated in aligned notches in the edges of the assembled boards. The fastener 38, which is described in greater detail hereinafter with reference to FIG. 3, includes a vertical standard 74 with a lowermost fixed abutment in the form of a circular flange 62, a single spacer sleeve 64 which is axially moveable on standard 74, a pair of spacer rings 66 and 68 which, together, comprise an axially extendable spacer, and a clevis spacer 70. The flange 62 is received in a counterbore 72 in the notch 40 of the lowermost plate 12. The upper end of spacer sleeve 64 supports intermediate plate 14 at a predetermined increment of the overall height of the fixture, e.g., at 50% of this height. The spacer clevis 70 supports the uppermost plates 18 and 20 at a predetermined, precise spacing, e.g., plate 18 is located at 85% of the height of the fixture. The axially extendible spacer formed by rings 66 and 68 support intermediate plate 16 and compress the entire assembly. For this purpose, the standard has an internal through slot 76 (best seen in FIG. 3) which receives a slide block 80 that has an internally threaded bore which receives taper-headed screws 90 that serve as cams to extend or retract the axial separation of the rings 66 and 68. The uppermost plate 20 rests on the third intermediate plate 18 and has a precisely located notch 92 that is received about the uppermost head 94 of the fastener.

A thin sheet of plastic, preferably MYLAR., (not shown) is received between the third intermediate plate 18 and the uppermost plate 20 and this sheet has small diameter apertures to receive the ends of the test probes 96 which have a dimple 98 which obstructs passage of the probes through the small diameter apertures in the plastic sheet, thereby retaining the probes in the fixture.

The test probes 28 and 96 are slender metal pins approximately 0.02 to 0.06" in diameter and approximately 2.5 to 3 inches in length, with the aforementioned dimple 98 at their uppermost, pointed ends 100.

Referring now to FIG. 3, the fastener 38 of the invention is illustrated in exploded view. As there illustrated, the fastener 38 has a standard 74 in the form of a generally cylindrical rod which has a fixed abutment in the form of a circular flange 62 at its lower end and an enlarged head 94 at its upper end. The standard 74 has a large diameter shank 102 along its lower half, and this shank 102 has a through aperture 104. A spacer sleeve 64 is slidably received over the shank 102 and is retained thereon by a pin 106 which extends through the larger diameter aperture 104. In this fashion, the spacer sleeve 64 has a limited degree of axial movement on the standard 74.

The cylindrical standard 74 has another larger diameter shank 108 which has a through slot 76 that receives the slide block 78. The slide block 78 has an internally threaded through bore 80, which receives, at its opposite ends, taper headed screws 90, which have large diameter tapered heads 110. The shank 108 of the cylindrical standard 74 is surrounded by a pair of spacer rings 66 and 68 have a pair of diametric arcuate notches 120 and 122 in their opposed surfaces 124 which align with t-headed screws 90. The arcuate notches function as cam followers on the cams provided by the tapered heads 110 of the screws 90. The spacer rings 66 and 68 thus form an axially expandable spacer which is expanded by advancement of the screws 90 into the slide block 78 and which is contracted by retraction of the screws 90 from the slide block 78.

The rings 66 and 68 also have diametric through apertures 112 and 114 which receive pins 116 that seat in axial grooves 118 on opposite sides of the shank 108 to align the notches 120 and 122 with the threaded bore 80 of the slide block 78, while permitting axial movement of the rings on the standard 74.

The fastener also has a clevis spacer 70 which has through apertures 126 and 128 in each of its legs 130. A pin 132 extends through these apertures and through a larger diameter transverse bore 134 in the upper end of the cylindrical standard 74. The internal wall of the aperture thus functions as a stop or abutment limiting the maximum axial displacement of the clevis spacer 70 and is precisely oriented on the cylindrical standard 74 to provide a precise location of plate 18 of the fixture.

The fastener of the invention has fixed abutments at its ends and axially adjustable spacers along its length. One of the spacers is axially expandable and includes a cam adjustment to provide fixed adjustment of its extension in the assembly.

Figure 4:
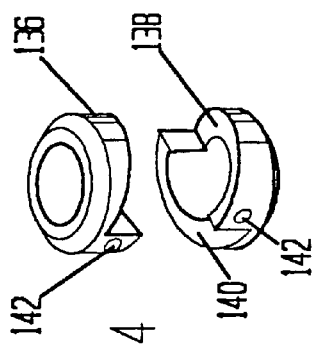
FIG. 4 is a view of an alternative extendable spacer useful in the invention.

Alternative constructions of the axially extendable spacer can be provided. FIG. 4 illustrates a pair of expandable rings 136 which are similar in construction to the previously described rings 66 and 68, but which have mating helical ramps 138 and 140 to provide for a variable expansion of the rings upon relative rotation. The rings 136 can have recesses 142 in their outer periphery to receive a spanner and the like permitting their relative rotation for axial expansion and contraction. If desired, the ramp surfaces of the rings 136 can have a,textured or roughened surface to prevent accidental retraction of the expanded rings.

Figure 5:
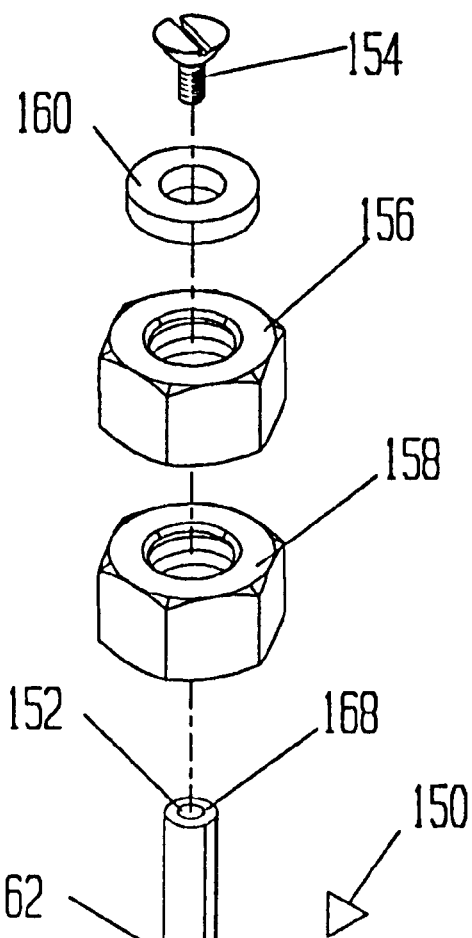
FIG. 5 is a perspective view of an alternative fastener of the invention.

Referring now to FIG. 5, an alternative fastener is shown. This fastener comprises an externally threaded post 150 which has distal, internally threaded bores 152 which receive assembly screws 154.

Figure 6:
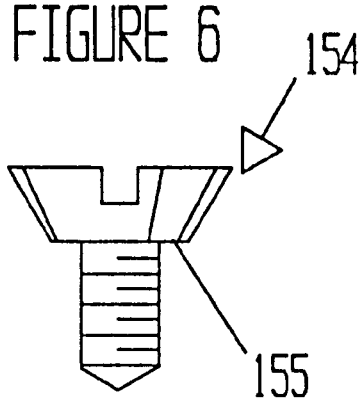
FIG. 6 is a side view of the screws used with the alternative fastener of this invention.

FIG. 6 is an enlarged elevational view of screw 154 which has a tapered head with a flat undersurface 155 which serves as a land that seats against the upper end 168 of the post 150, as described in greater detail with reference to FIG. 7.

The post 150 is provided with a pair of nuts 156 and 158, and an upper spacer washer 160. The post 150 has a reduced diameter neck 162 and an externally threaded shank 164 at its midsection, and an unthreaded bottom section 166 which are separated by an annular groove 170.

Referring now to FIG. 7, the structure of the test fixture and the fasteners can be seen in greater detail. As there illustrated, each fastener post 150 is seated in aligned notches in the edges of the assembled boards. The reduced diameter neck 162 and groove 170 are of lesser diameter than the width of the end notches in the boards to permit some lateral adjustability of the boards, which are aligned by the standoffs 50.

The upper end 168 of fastener post 150 provides an upper fixed support for the uppermost plate 20 and the tapered head of screw 154 secures the uppermost plate 20 (see FIG. 8). The lower end 166 of the post 150 provides a lower fixed support for the lowermost board 12. In the embodiment shown in FIGS. 7 and 9, the lower board is provided with a conventional countersunk hole 175 and a tapered flat head screw 176.

The intermediate board 14 rests on the upper end 174 of the bottom section 166 of post 150 and is tightly engaged against the upper end 174 of the bottom section 166 by lower nut 158. The intermediate board 16 is separated from the upper board 18 by spacer washer 160 and its height is controlled by tightening of the upper nut 156. The nuts 156 and 158 on the threaded shank 164 of post 150 thereby function as an axially expanding spacer.

Since the lowermost board is usually formed of G10, a material with a closely controlled thickness, the resultant assembly will provide a fixture with precise dimensions A and B.

In some applications wherein the thickness of the lowermost board 12 is variable, it is preferred to use fastener screws 154 to secure the lowermost board, in the manner shown in FIG. 10. This provides a fixture in which the dimensions A and B are precisely controlled.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. In a method for the assembly of a fixture for testing of printed circuit boards wherein a plurality of test pins are placed in a vertical to near vertical spaced apart array corresponding to the locations of test points of a circuit board in aligned through apertures of a plurality of support plates including an uppermost plate, a lowermost plate, and at least one intermediate plate, which are in a spaced apart parallel array, the improvement which comprises:
   a. placing at least one support post having a plurality of axially adjustable plate spacers including at least one axially expandable plate spacer and distal fixed support elements into engagement with said support plates along their side edges by;
      (1) locating one of said distal fixed support elements in abutment with one of the uppermost and lowermost support plates;
      (2) positioning one of said axially adjustable plate spacers between said intermediate plate and one support plate;
      (3) placing said axially expandable spacer between said intermediate support plate and the other of said uppermost and lowermost support plates; and
      (4) expanding said axially expandable spacer to abut said other support plate against its respective fixed distal support element and thereby adjust said uppermost and lowermost plates to a controlled spaced apart distance.

2. The method of claim 1 wherein said array of plates includes said uppermost and lowermost plates and upper and lower intermediate plates and said support post includes a spacer which is positioned between said lowermost plate and said lower intermediate plate to adjust the locations of the plates to a precise spaced-apart distance, and said expandable spacer is positioned between said upper and lower intermediate plates.

3. The method of claim 2 wherein said support plates are rectangular.

4. The method of claim 3 wherein said fixture is assembled with at least four said support posts which are located, one each along each of the four edges of the rectangular support plates.

5. The method of claim 2 wherein said support plates are positioned in said array at predetermined spaced-apart increments and retained in said array while positioning said at least one support post.

6. The method of claim 5 wherein said lower intermediate plate is located at approximately the vertical middle of said array and said upper intermediate support plate is located approximately at the vertical middle of the space between the uppermost plate and the lower intermediate plate.

7. The method of claim 2 wherein said axially expandable spacer is located between said intermediate plates and axially adjustable spacers are located between each of the outermost plates and adjacent intermediate plate.

8. The method of claim 2 wherein each of said plates has a plurality of aligned edge notches, at least one in each of its sides and located in vertical alignment with respective edge notches in the sides of the others of said plates, and including the steps of placing one said support post having a plurality of axially adjustable plate spacers into said aligned edge notches of said plates.

9. A method for the assembly of a plurality of plates comprising an uppermost, a lowermost and at least two intermediate plates in a parallel, spaced apart array which comprises:

a. providing through apertures in said plates at substantially identical locations along the sides of each plate to provide sets of vertically aligned apertures when said plates are assembled in said parallel array;

b. assembling and temporarily supporting said plates in said parallel, spaced array at predetermined spacings;

c. positioning a support post having distal fixed support elements and axially moveable support elements in each set of aligned apertures with the uppermost and lowermost plate of said array being secured in abutment against said distal fixed support elements; and d. positioning said axially moveable support elements above and below each of said intermediate plates and adjusting the heights of each of said intermediate plates by axial movement of said moveable support elements.

10. The method of claim 9 wherein said through apertures are edge notches, at least one each in each side of said boards, with the respective notches of all boards being in vertical alignment, thereby permitting one said support post to be positioned in said aligned notches without disassembly of said array.

11. The method of claim 10 wherein one of said axially adjustable spacers is an axially expandable spacer and including the step of placing said axially expandable spacer between said one of said intermediate support plates and one of said uppermost and lowermost support plates to thereby adjust said uppermost and lowermost plates to a controlled spaced apart distance.

* * * * *